United States Patent [19]

Mattausch et al.

[11] Patent Number: 5,040,146
[45] Date of Patent: Aug. 13, 1991

[54] STATIC MEMORY CELL

[75] Inventors: Hans-Juergen Mattausch, Brunnthal-Faistenhaar; Bernhard Hoppe, Munich; Gerd Neuendorf, Germering; Doris Schmitt-Landsiedel, Ottobrunn; Hans-Joerg Pfleiderer, Zorneding; Maria Wurm, Ottobrunn, all of Fed. Rep. of Germany

[73] Assignee: Siemens Aktiengesellschaft, Munich, Fed. Rep. of Germany

[21] Appl. No.: 491,201

[22] Filed: Mar. 9, 1990

[30] Foreign Application Priority Data

Apr. 21, 1989 [DE] Fed. Rep. of Germany ....... 3913210

[51] Int. Cl.$^5$ .......................... G11C 11/34; G11C 7/00
[52] U.S. Cl. .................................... 365/154; 365/190; 365/156
[58] Field of Search ................... 365/154, 190, 230.05, 365/189.04, 156

[56] References Cited

U.S. PATENT DOCUMENTS 4,768,172 8/1988 Sasaki .............................. 365/154 X
4,792,924 12/1988 Rubinstein .......................... 365/154

OTHER PUBLICATIONS

Weiss, H. et al., "Integrierte MOS Schaltungen", Springer-Verlag Berlin, Heidelberg, 1982, pp. 244-245.

Primary Examiner—Joseph A. Popek
Attorney, Agent, or Firm—Hill, Van Santen, Steadman & Simpson

[57] ABSTRACT

Memory cells are disclosed that avoid the utilization of analog circuits in the memory peripheral circuits when they are utilized in static memory modules and that intended to enhance the disturbed reliability when confronted by technology modifications and parameter fluctuations. Write-in thereby occurs from a write data line via a write selection transistor and read-out occurs via a read selection transistor onto a read data line. A second inverter formed of two field effect transistors serves as a feedback element in order to statically maintain the cell information. Due to an implemented asymmetry in the dimensioning between the first and second inverters, the memory cell is significantly less susceptible to information loss upon read-out when compared to a heretofore known memory cell. A precharging of the read data line is not required with these memory cells.

15 Claims, 2 Drawing Sheets

STATIC MEMORY CELL

BACKGROUND OF THE INVENTION

1. Field of the Invention

The present invention relates to a static memory cell of the type comprising two transfer transistors of the first conductivity type, two inverters, two data lines and at least one first word line and in which a first terminal of the first transfer transistor is connected to the first data line, a first terminal of the second transfer transistor is connected to the second data line, an input of the first inverter is connected to a second terminal of the first transfer transistor and an output of the first inverter is connected to a second terminal of the second transfer transistor, and in which one input of the second inverter is connected to the output of the first inverter and an output of the second inverter is fed back to the input of the first inverter and a gate terminal of the first transistor is connected to the first word line.

2. Description of the Prior Art

Metal-oxide-semiconductor (MOS) memories belong to a type of integrated circuits having a high degree of integration; they can be divided into the following main groups according to the type of their information storage: MOS memories having dynamic information storage; MOS memories having static information storage; and MOS memories having non-volatile information storage. In the present case, the middle group of MOS memories, i.e. the static memories are of special interest. The information that was written into the memory cell was thereby stored, whereby the memory cell retains its condition once set until the supply voltage is disconnected or is no longer applied to the memory cell for other reasons. It is possible to structure the memory cells with various MOS techniques. Complementary metal-oxide-semiconductor (CMOS) technology has proven particularly advantageous with reference to low-loss technology. A typical 6-transistor memory cell constructed in accordance with CMOS technology is shown by H. Weiss, K. Horninger, "Integrierte MOS-Schaltungen" Springer-Verlag, 1982, p. 229, FIG. 4.73c. It is composed of a cross-coupled flip-flop, whereby two selection transistors produce the connection between the two data lines and the memory nodes. The 6-transistor memory cell is addressed via the word line when reading and writing and is connected to a pair of data lines. A logical "0" or "1" is stored in the memory cell dependent on whether the left-hand memory node lies at the reference potential or at the potential of the supply voltage. Transverse current between the supply voltage and the reference potential does not flow through the memory cell in either case since one of the transistors in the two flip-flop branches inhibits and the other is activated.

In arrangements of this type, there is the risk when reading out a memory cell, that the condition thereof will be changed due to charge transfer from the one or other memory node onto the data lines. The widths of the selection transistors therefore must not be excessively great in relationship to the n-channel transistors in the storage flip-flop. On the other hand, the selection of the selection transistors must be large enough in relationship to the p-channel transistors in the storage flip-flop in order to enable the write-in operation. These p-channel transistors serve the purpose of keeping the cell information static and can be dimensioned with a minimum channel width. The original requirements in the dimensioning of the symmetrical 6-transistor cell lead to the necessity of reliability analyses of parasitic signals for the design of such a memory cell, particularly with respect to influence of technology fluctuations. Existing designs must be checked and generally modified given variation of the technology parameters, when switching to dimensionally-diminished geometries (shrink) and when changing the supply voltage. The limitation in the width of the selection transistors also limits the obtainable speed. In practice, the static semiconductor memories having six-transistor memory cells, data lines that are not selected are frequently pre-charged to a fixed potential. After a write access, the data line pair used for writing is additionally connected by a transistor in order to shorten the write recovery time by charge balancing between these two lines. The disturb reliability, the speed and the access time are increased as a result of these measures. It is also set forth in the aforementioned publication, Pages 244 through 255, that the data lines are generally supplied to a differential amplifier for fast ignition of the cell signal during reading. The discharging of one of these two data lines is then recognized in the differential amplifier. The evaluation occurs at a time at which the data lines have not yet reached a logical level, but only have a potential difference of a few hundred millivolts. The time thereby gained, however, is purchased at the expense of using an analog circuit that uses a large area and that, like the memory cell, is susceptible to technology-caused fluctuations of the operating point.

SUMMARY OF THE INVENTION

The object of the present invention is to provide an improved circuit for memory cells in CMOS technology that have a shortened access and write recovery time in comparison to memory cells heretofore known, and that require small dimensions for the periphery circuit.

The above object is achieved, according to the present invention, in a first embodiment thereof in which a static memory cell comprises two transfer transistors of a first conductivity type, two inverters, two data lines and at least one first word line, whereby a first terminal of the first transfer transistor is connected to the first data line, a first terminal of the second transfer transistor is connected to the second data line, an input of the first inverter is connected to a second terminal of the first transfer transistor, an output of the first inverter is connected to a second terminal of the second transfer transistor, one input of the second inverter is connected to the output of the first inverter, an output of the second inverter is fed back to the input of the first inverter, and a gate terminal of the first transfer transistor is connected to the first word line, and is particularly characterized in that a gate terminal of the second transfer transistor is connected to a second word line, the first word line is a write word line for activating the first transfer transistor during a write event and the second word line is a read word line for activating the second transfer transistor during a read event, the first data line is a write data line by way of which data are written into the memory cell, and in that the second data line is a read data line by which data are read from the memory cell.

The above object is also achieved, according to the present invention, in an embodiment thereof in which a static memory cell comprises two transfer transistors of the first conductivity type, two inverters, two data lines and at least one first word line, a first terminal of the first transfer transistor is connected to the first data line, a first terminal of the second transfer transistor is connected to the second data line, an input of the first inverter is connected to a second terminal of the first transfer transistor, an output of the first inverter is connected to a second terminal of the second transfer transistor, an input of the second inverter is connected to the output of the first inverter, an output of the second inverter is fed back to the input of the first inverter, a gate terminal of the first transfer transistor and of the second transfer transistor is connected to the first word line, and is particularly characterized in that the first word line is a write word line and a read word line for activating the first transfer transistor during the write event and for activating the second transfer transistor during the read event, in that a fifth transfer transistor of a first conductivity type is connected between the first transfer transistor and the first inverter, the second terminal of the first transfer transistor is connected to a first terminal of the fifth transfer transistor, the input of the first inverter is connected to a second terminal of the fifth transfer transistor, a gate terminal of the first transfer transistor is connected to a column write word line, whereby the column write word line activates the fifth transistor when writing data into the memory cell.

The advantages achieved in practicing the present invention are particularly that the utilization of analog circuits such as, for example, the analog differential amplifiers, is avoided and the disturbed reliability against technology modifications and parameters fluctuations is enhanced by utilizing memory cells constructed in accordance with the invention. These advantages are particularly achieved in combination with short bit lines, as is the case in small memories or in memories having hierarchy architecture.

A particular feature of the invention, with respect to a static memory cell constructed in accordance with the first-mentioned embodiment, is particularly characterized in that a third inverter is connected between the first inverter and the second transfer transistor, whereby one input of the third inverter is connected to the output of the first inverter and one output of the third inverter is connected to the second terminal of the second transfer transistor.

According to another feature of the invention, with respect to the same first-mentioned embodiment, a static memory cell is particularly characterized in that the first transfer transistor of a first conductivity type is fashioned to form a transfer gate by a third transfer transistor of the second conductivity type connected parallel thereto, and in that a gate terminal of the third transfer transistor is connected to a third word line, whereby the third word line is a write word line for activating the third transfer transistor during a write event.

According to another feature of the invention, again with respect to the same first-mentioned embodiment, a static memory cell is particularly characterized in that a fourth transfer transistor of a first conductivity type is connected between the first transfer transistor and the first inverter, whereby the second terminal of the first transfer transistor is connected to a first terminal of the fourth transfer transistor and the input of the first inverter is connected to a second terminal of the fourth transfer transistor, and in that a gate terminal of the fourth transfer transistor is connected to a column word line, whereby the column word line activates the fourth transfer transistor during a writing or reading of data into or out of the memory cell.

According to a feature of the invention, with respect to the second-mentioned embodiment, a static memory cell is particularly characterized in that an inverter contains a field effect transistor of the first conductivity type and a field effect transistor of the second conductivity type, in that a gate terminal of the field effect transistor of the first conductivity type and a gate terminal of the field effect transistor of the second conductivity type together form an input of the inverter and a first terminal of the field effect transistor of the first conductivity type and a first terminal of the field effect transistor of the second conductivity type together form an output of the inverter, and in that a second terminal of the field effect transistor of the first conductivity type is connected to a first voltage connecting point and a second terminal of the field effect transistor of the second conductivity type is connected to a second voltage connecting point.

According to another feature of the invention, with respect to a static memory cell constructed in accordance with the second-mentioned embodiment and with the aforementioned particular feature, the static memory cell is particularly characterized in that the first and second inverters are asymmetrically designed with respect to one another, whereby the channel width of the field effect transistor of the first conductivity type and the channel width of the field effect transistor of the second conductivity type of the respective first inverter are identically selected and the channel length of the field effect transistor of the first conductivity type and the channel length of the field effect transistor of the second channel type of the respective first inverter are selected minimal, so that the first inverter comprises an asymmetrical threshold, and in that the channel width of the field effect transistor of the first conductivity type and the channel width of the field effect transistor of the second conductivity type of the respective second inverter are selected identical and minimal and the channel length of the field effect transistor of the second conductivity type in the second inverter is dimensioned approximately twice as large as the minimally-selected channel length of the field effect transistor of the second conductivity type in the second inverter, so that the second inverter comprises an asymmetrical threshold unequal to half the supply voltage, whereby the minimal channel length is prescribed by the technological manufacturing process.

According to another feature of the invention, and with respect to the second-mentioned embodiment and the last-discussed feature, a static memory cell is particularly characterized in that the channel width of the second transfer transistor of the first conductivity type is to be dimensioned considerably larger than the channel width of the field effect transistor of the first conductivity type in the first inverter in order to be able to modulate the read data line faster. According to another feature of the invention, and with respect to a static memory cell constructed in accordance with the first-mentioned feature of the second-mentioned embodiment, a static memory cell is particularly characterized in that a field effect transistor of the first conductivity type is an n-channel field effect transistor and the field effect transistor of the second conductivity type is a p-channel field effect transistor, in that the first connecting point is connected to a reference voltage potential, and the second connecting point is connected to a supply potential.

According to another feature of the invention, and with respect to the first and the second-mentioned embodiments, the field effect transistor of the first conductivity type is a p-channel field effect transistor and the field effect transistor of the second conductivity type is an n-channel field effect transistor, and in that the first connecting point is connected to a supply voltage and the second connecting point is connected to a reference potential.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
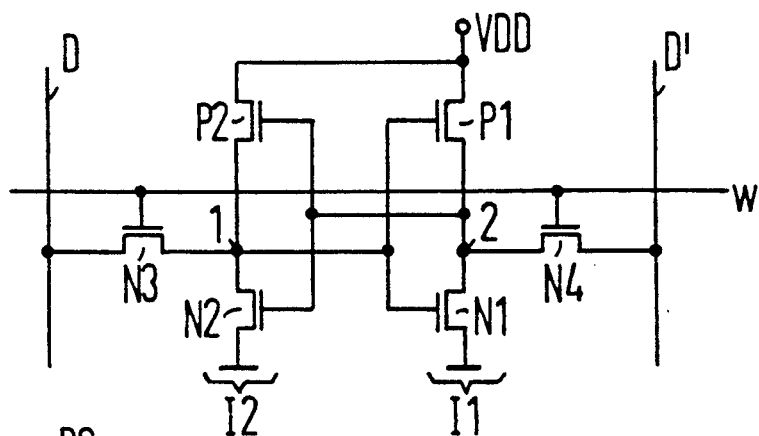
FIG. 1 is a schematic circuit diagram of a static memory cell constructed in accordance with CMOS technology and as heretofore known in the art.

FIG. 1 shows a memory cell for static memories constructed in accordance with complementary channel technology (CMOS technology). It contains a cross-coupled flip-flop which is formed above two inverters I1 and I2. The information for the memory cell is written in or, respectively, read out via a data line D, D' and the memory cell is selected via a word line W. When, for example, a voltage of zero volts is applied to the a memory node 1 during a read-in event, the n-channel field effect transistor N1 inhibits, whereas the n-channel field effect transistor N2 is transmissive. A voltage of zero volts is then applied at the memory node 1, whereas a voltage that corresponds to the supply voltage VDD is applied at the memory node 2. When the selection transistors N3 and N4 inhibit, the flip-flop remains in its defined condition and does not flip into the other state until opposite voltage levels are applied to the data lines D, D' and until the selection transistors N3, N4 are transmissive. The state of the memory cell is read in the same manner by identifying the potentials at the memory nodes 1 and 2. The dissipated power of the memory cell as held as low as possible by employing complementary channel technology. In both stable conditions, either only the n-channel field effect transistor N1, and the field effect transistor P2 of the p-channel field effect transistor P1 and the n-channel field effect transistor field effect transistor N2 remain open. A transmissive current thereby flow only during the switch-over event.

In greater detail, the memory cell of FIG. 1 is constructed in the following manner. The inverter I1 contains an n-channel field effect transistor N1 and a n-channel field effect transistor P1, whereby the second inverter I2 contains an n-channel field effect transistor N2 and the p-field effect transistor P2. Both p-channel field effect transistors P1 and P2 each have a first terminal connected to the supply voltage VDD, whereas a respective first terminal of the two n-channel field effect transistors N1 and N2 is to be connected to the reference potential. The input of the first inverter I1 is formed with the assistance of the two gate terminals of the field effect transistors P1 and N1 and is connected to the data line D via a n-channel selection transistor N3. The output of the first inverter I1 is respectively formed with the assistance of a second terminal of the p-channel field effect transistor P1 and of the n-channel field effect transistor N1 and is connected to the inverse data line D' via a n-channel selection transistor N4. The second inverter I2 thereby has its input formed of the two gate terminals of the field effect transistors P2 and N2 connected to the output of the inverter I1, whereas the output of the inverter I2 is formed with the assistance of the second terminal of the field effect transistor P2 and of the second terminal of the field effect transistor P2 and is to be connected to the input of the inverter I1. For storing information, the memory cell contains two memory nodes 1 and 2, whereby the memory node 1 is formed of the conductive connection between the output of the inverter I2 and the input of the inverter I1 and the memory node 2 derives from the conductive connection between the output of the inverter I1 and the input of the inverter I2. The word line W is connected to the two gate terminals of the selection transistors N3 and N4 and activates both selection transistors in the case of a write-in or, respectively, read-out.

The transistors N1 and N2, P1 and P2, as well as the transistors N3 and N4, are to be identically dimensioned in pairs. As already initially mentioned, the width of the selection transistors N3 and N4 must not be selected too great in relationship to the n-channel transistors in the storage flip-flop N1 and N2. On the other hand, the width of the selection transistors must be large enough in relationship to the p-channel transistors P1 and P2 in order to enable writing. The transistors P1 and P2 thereby serve the purpose of statically maintaining the cell information and can be dimensioned with minimum widths. Let the following be considered as an example for dimensioning:

$$W(N1):W(N3):W(P1)=1.5:1:1.$$

Figure 2:
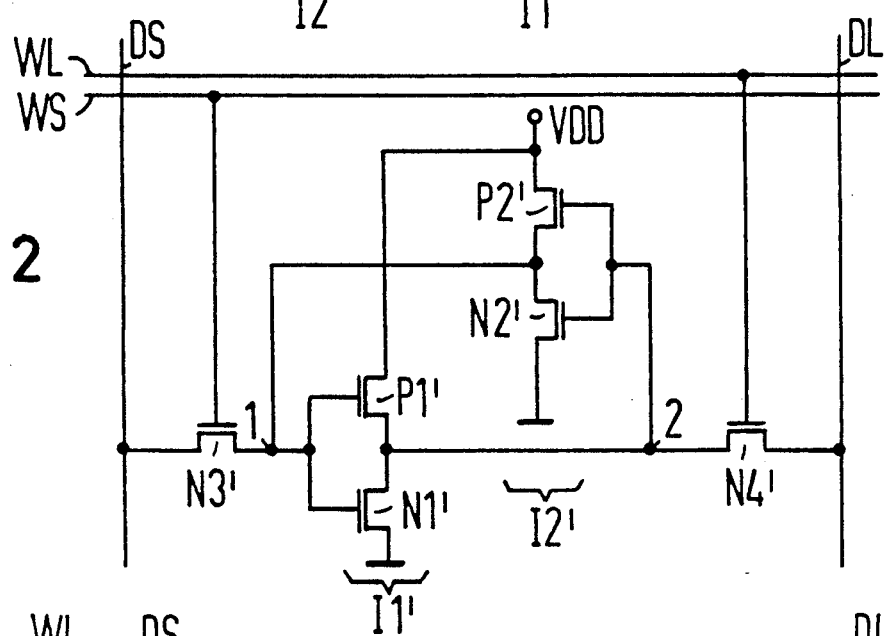
FIG. 2 is a schematic circuit diagram of a 6-transistor memory cell constructed in accordance with the present invention and having separate write and read word lines and separate write and read data lines.

FIG. 2 illustrates a six-transistor memory cell constructed in accordance with the present invention and having separate write and read word lines and separate write and read data lines. It also differs in circuit-oriented terms from the memory cell illustrated in FIG. 1 on the basis of the presence of two word lines WL and WS for reading or, respectively, writing, as well as on the basis of the terminal connections of the selection transistors N3' and N4'. In contrast to the memory cell of FIG. 1, respectively one data line DS is utilized for writing and one data line DL is utilized for reading. The interconnection of the two inverters I1' and I2' is thereby undertaken as in the preceding memory cell. The inverter I1' contains the p-channel field effect transistor P1' and the n-channel field effect transistor N1' and a feedback inverter I2' contains the p-channel field effect transistor P2' and the n-channel field effect transistor N2'. The two inverters are to be connected between the supply voltage VDD and the reference potential, ground in this case. The n-channel selection transistor N3' produces a connection between the write data line DS and the input of the first inverter I1', as well as the output of the fedback second inverter I2' and the n-channel selection transistor N4' connects the read data line DL to the output of the first inverter I1' and to the input of the fedback inverter I2'. The selection transistor N3' for reading information into the memory cell has its gate terminal connected to the word line WS, whereas the selection transistor N4' that serves the purpose of reading of the memory cell onto the read data line DL has its gate terminal connected to the write word line WL.

The write-in into the six-transistor memory cell constructed in accordance with the present invention occurs from the write data line DS via the write selection transistor N3' that is driven by the write word line WS Reading is undertaken via the read selection transistor N4' that is driven by a read word line WL onto the read data line DL. The cell signal is read out onto the read data line DL via the read selection transistor N4' by the inverter I1' formed of the field effect transistors N1' and P1'.

In the six-transistor memory cell constructed in accordance with the present invention, both logical states of the memory cell are read out via the read data line DL. The p-channel transistor P1' in the first inverter I1' must therefore be dimensioned adequately wide in order to be able to charge the read data line DL. The inverter I2', formed of the field effect transistors N2' and P2', serves as feedback here in order to statically maintain the cell information These two field effect transistors can therefore be designed with a minimum channel width and a minimum channel length. As a result of this existing asymmetry of the two inverters I1' and I2', the cell becomes significantly more reliable against information loss upon reading then a memory cell constructed in accordance with the prior art. A precharging of the read data line DL is not required in this memory cell. The channel width of the read selection transistor N4' in relationship to the n-channel field effect transistor N1' in the first inverter I1' can be selected greater than in the standard six-transistor cell, so that the read data line DL is selected faster. The speed, when reading out of the memory cell, can be exchanged for the required area on the basis of the selection of the channel widths of the field effect transistor N1', P1' and N4'. A shorter read access time can therefore be achieved as long as the capacitance of the data line DL does not belong excessively high, as particularly occurs in small memories or memories having hierarchic architecture. Since a precharging of the read data line is thereby not required, no precharging time has to be taken into consideration as part of the cycle time during write-in and read-out.

No read amplifier that is involved and susceptible to disturbance is required in the memory cell of FIG. 2 for recognizing the cell signal, since an inverter or a simple, one-stage comparator circuit is adequate in the evaluation of the cell signal. The reliability against technology fluctuations is thereby again enhanced and the possibilities when switching to dimensionally-diminished geometries (shrink) are improved. Further, the required chip area can be reduced due to the more simple read circuit that no longer requires an analog differential amplifier, and a more compact structure, in turn, is possible as a result thereof. Since the write-in from the write data line DS occurs via an n-channel transistor N3', only the voltage VDD-VT' is available at the memory node 1 for the write-in of a high signal, whereby VT' is the threshold voltage of the n-channel field effect transistor at the substrate bias VDD-VT'. It is therefore beneficial to place the threshold of the inverter I1' at a lower voltage than VDD/2, this, for example, being possible on the basis of the dimensioning of the same channel widths for the field effect transistors N1' and P1'. The write data line DS need not be recharged to a defined level after writing. As a result, it is likewise not necessary to observe write recovery time within the write cycle time.

Figure 3:
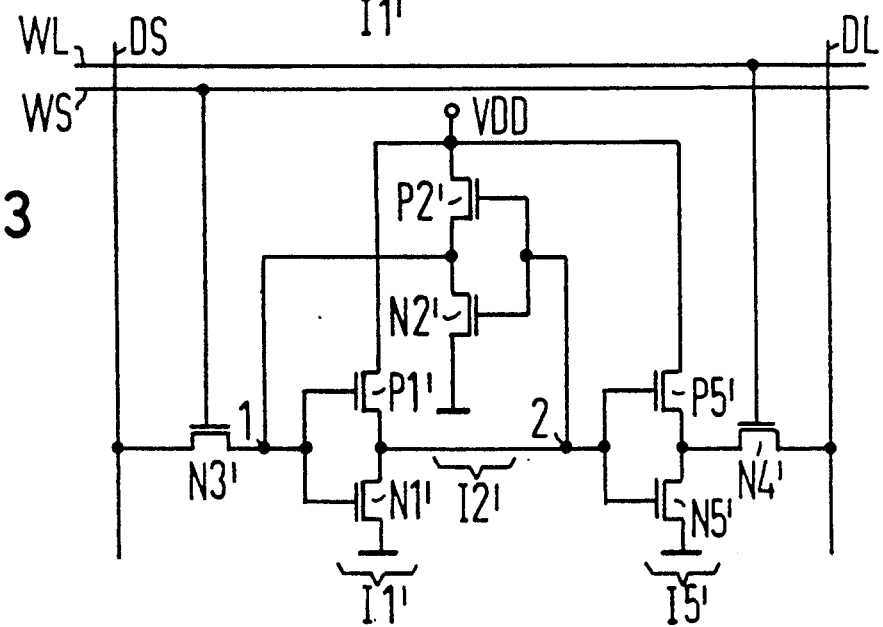
FIG. 3 is a schematic circuit diagram of an 8-transistor memory cell constructed in accordance with the present invention.

FIG. 3 shows a further embodiment of a memory cell constructed in accordance with the present invention and having separate write and read word lines WS, WL as well as write and read data lines DS and DL. In terms of fundamental connection, the memory cell of FIG. 3 corresponds to that of FIG. 2, so that the same reference characters are thereby employed. In addition, an inverter I5' is inserted between the memory node 2 and the read selection transistor N4' in the memory cell of FIG. 3. The inverter I5' contains a p-channel field effect transistor P5' and an n-channel field effect transistor N5', whereby a first terminal of the field effect transistor P5' is connected to the supply voltage VD, a first terminal of the field effect transistor N5' is connected to the reference potential (ground in this case), and the input of the inverter I5' is formed of the two gate terminals of the field effect transistors P5' and N5' and the output of the inverter is formed by respectively second terminals of the field effect transistors P5' and N5'. As a result of this additional inverter I5', the stored cell signal is already amplified in the memory cell during reading. Moreover, the channel width of the selection transistor N4' can be selected without taking into consideration the disturbed susceptibility of the memory cell since the read data line DL is decoupled from the memory node 2. The channel widths of the field effect transistors N1' and P1' in the first inverter I1' have to be selected taking only the threshold during write-in into consideration. They should therefore be dimensioned optimally small. Particularly short read and write times can be achieved with this memory cell.

As a dimensioning example, the inverter I1' in the memory cell of FIG. 3 can be selected such for write-in that the channel width of the p-channel field effect transistor P1' corresponds to the channel width of the n-channel field effect transistors N1', so that the threshold of the inverter I1' is less than half the supply voltage VDD/2. The n-channel field effect transistor N5' should have twice the channel width of the p-channel field effect transistor P5', whereby the channel width of the p-channel field effect transistor P5' should correspond to approximately 3 times that of the p-channel and n-channel field effect transistors P1' and N1'. A disturb-free reading of the data from the memory cell is assured as a result thereof.

Figure 4:
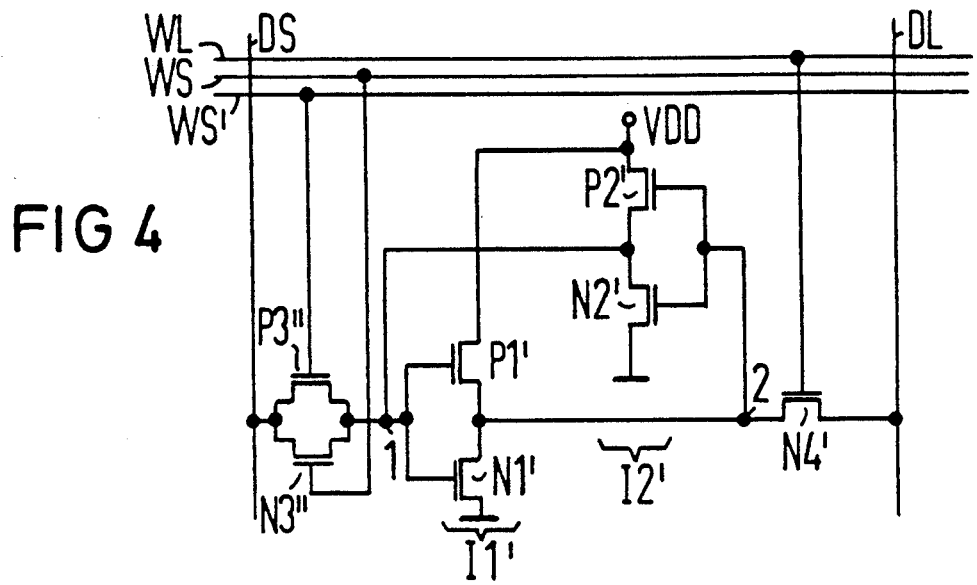
FIG. 4 is a schematic circuit diagram of a 7-transistor memory cell constructed in accordance with the present invention and having a CMOS transfer gate as a write selection circuit.

FIG. 4 shows seven-transistor memory cell constructed in accordance with the invention and having a CMOS transfer gate as a write-in selection circuit. In turns of its fundamental connection, this memory cell corresponds to that of FIG. 2 so that the inverters I1' and I2', as well as the selection transistor N4' are to be connected as therein. Especially in technologies having high substrate control, the write-in becomes faster and more disturbproof when the selection transistor N3" is expanded by a parallel circuit of a p-channel field effect transistor P3" with a CMOS transfer gate. A further write word line WS' with the inverted write word line signal is then required. The gate terminal of the n-channel selection transistor N3' is therefore wired to the write word line WS and the gate terminal of the p-channel selection transistor P3" is connected to the write word line WS'. It is thereby adequate when the write word line WS' is activated somewhat later than the write word line WS during writing of data into the memory cell. A more high-impedance conductor extent can therefore be selected for the write word line WS' then for the write word line WS without having the turn-on time into the memory cell being lengthened as a result thereof.

Figure 5:
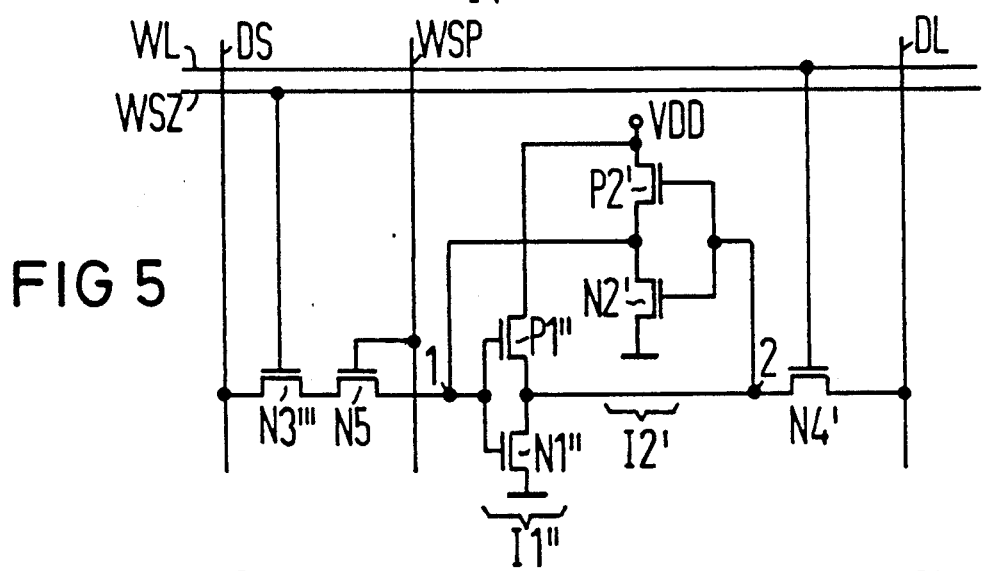
FIG. 5 is a schematic circuit diagram of another 7-transistor memory cell constructed in accordance with the present invention and having two write selection transistors connected in series and three word lines.

FIG. 5 shows a seven-transistor memory cell constructed in accordance with the invention and comprising two write selection transistors and three word lines. Just as in the preceding figures, the fundamental wiring of the first and second inverters I1', and I2" and of the selection transistor N4' corresponds to that of FIG. 2. The same reference characters are therefore also employed here. The write word lines WSZ and WSP manage the write-in of information at exactly the appertaining memory cell. In order to prevent having to charge the write data line DL to a well-defined potential before each write-in, the dimensioning of the n-channel selection transistor required for writing, as well as of the transistors in the first inverter in the memory cells of FIGS. 2-4, must be selected such that the cell state cannot be changed by charged transfer when writing a different memory cell at the same word line. The optimum dimensioning is technology dependent and retards the writing of the memory cell. In general, the requirement for stability of the cell against transfer of the charge of a disconnected data line limits the plurality of memory cell rows in the cell field.

These disadvantages do not arise in the memory cell of FIG. 5. It is selected via two series-connected n-channel write selection transistors N3''' and N5. The write selection transistor N3''' is selected by a row write word line WSZ that is arranged like the write word line in the memory cells of FIGS. 2-4 and selects a row of memory cells for writing. The write selection transistor N5 is selected by a column word line WSP extending perpendicularly thereto. As a result thereof, the memory node 1 is always connected to a write data line DS only at a single cell or, respectively, for a memory organization having the word width n given D memory cells. Since the memory cell is connected to the write data line DS by the row write word line WSZ only during writing, the column word line WSP need not be linked to the write-read selection. As a consequence of the above-described, asymmetrical design of the inverters I1" and I2', the memory cell of FIG. 5 is insensitive to charge transfer from the data lines during reading and writing. The dimensioning can therefore be optimized for achieving a short access time. The two series-connected transistors are selected optimally large in order to achieve an optimally low series channel resistance.

The two transistors in the inverter I1" are identically dimensioned in order to adapt the threshold to the level at the node 1 (VDD-VT', ground). In addition to the area requirement, the capacitive loads of the data line DS limit the width of the channels of the transistors N3''' and N5. A typical dimensioning would be $$W(N3'''):W(N5):W(N1''):W(P1'')=5:3:3.$$

The transistor widths are minimal in the inverter I2"; however, the channel length of the transistor N2' is selected twice as great as the channel width of the transistor P2' in order to achieve the same threshold as in the inverter I1". Conversion to dimensionally-diminished geometries (shrink) can be unproblemmatically carried out with this memory cell and the function of the memory cell is also assured given a reduction of the supply voltage. Savings in the column decoding balance the increased expense for the running of the additional column word line WSP.

Figure 6:
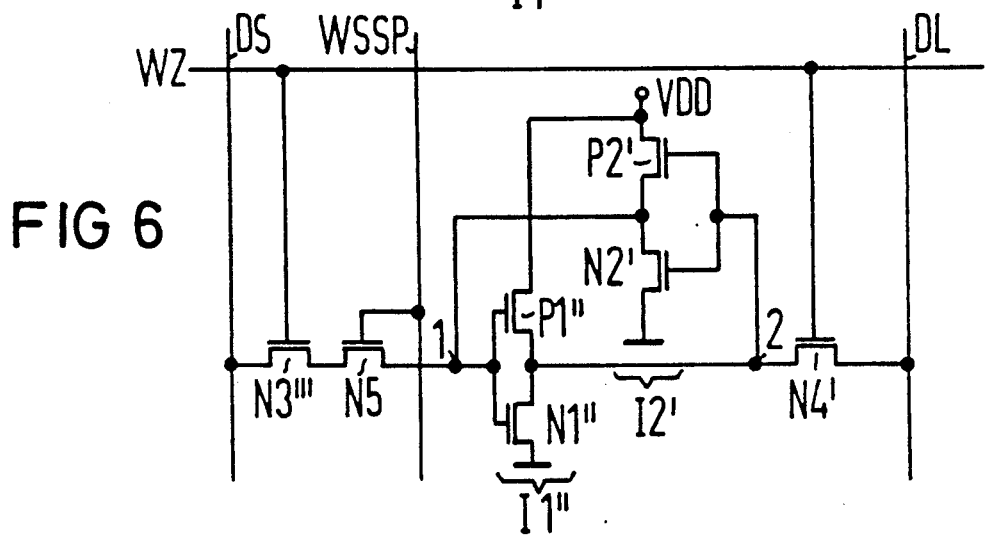
FIG. 6 is a schematic circuit diagram of a 7-transistor memory cell constructed in accordance with the present invention and having two write selection transistors connected in series and two word lines.

FIG. 6 shows a seven-transistor memory cell constructed in accordance with the present invention and having two series-connected write selection transistors N3''' and N5 and two word lines WZ and WSP. This thereby involves a modification of the memory cell of FIG. 5 wherein only one row word line WZ is required for writing and reading. In order to protect the memory cell against unintentional overwriting when reading, the column word line therein must be linked to the write selection, i.e. must be executed as a column write word line WSSP. The circuit expense in the row decoding is therefore traded off for the expense in the column decoding. The cell area becomes smaller due to the elimination of a line so that a more compact structure of the memory cell is possible. The individual row word line WZ is loaded with twice the plurality of selection transistor gates, since, for writing, the gate terminals of the selection transistor N3''' and, for reading of the memory cell, the gate terminal of the selection transistor N4' are to be respectively connected to the row word line WZ. In terms of the further basic connections, the memory cell of FIG. 6 corresponds to that of FIG. 5, whereby the same reference characters have again been employed. A selection between the memory cells of FIG. 5 and FIG. 6 is to be undertaken on a case-by-case basis from the differences deriving with respect to operating time and the required area for the memory cell.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A static memory cell comprising:
   first and second field effect transfer transistors of a first conductivity type including a gate and first and second terminals;
   first and second inverters each including an input and an output;
   first and second data lines;
   at least one first word line for receiving write and read control signals;
   said second terminal of said first transfer transistor connected to said first data line;
   said first terminal of said second transfer transistor connected to said second data line;

a third field effect transfer transistor of the first conductivity type including a gate and first and second terminals, said first terminal of said third field effect transistor connected to said input of said first inverter and said second terminal of said third field effect transistor connected to said first terminal of said first field effect transistor;

said input of said first inverter connected to said first terminal of said third transfer transistor;

said output of said first inverter connected to said second terminal of said second field effect transfer transistor;

said input of said second inverter connected to said output of said first inverter, and said output of said second inverter connected to said input of said first inverter to statically maintain the cell information;

said gate of said first field effect transfer transistor and said gate of said second field effect transfer transistor connected to said at least one first word line for activating said first field effect transfer transistor in response to a write control signal during a write event, and to activate said second field effect transfer transistor in response to a read control signal during a read event;

a column write word line for receiving write signals, said gate of said third field effect transfer transistor connected to said column word line for activating said third field effect transfer transistor during a write event to write data into the memory cell.

2. The static memory cell of claim 1, wherein:
each of said field effect transistors of said first conductivity type is an n-channel field effect transistor.

3. The static memory cell of claim 1, wherein:
said field effect transistor of said first conductivity type is a p-channel field effect transistor.

4. The static memory cell of claim 1, wherein
said first and second inverters are asymmetrically designed with respect to one another and each comprise at least one field-effect transistor of a first type of conductivity and at least one field-effect transistor of a second type of conductivity;

each of said field effect transistors of said first inverter comprising a channel including a length and a width, said channel widths being identical and said channel lengths being minimal so that said first inverter comprises an asymmetrical threshold;

each of said transistors of said second inverter comprising a channel including a length and a width, said widths being identical and minimal and said channel length of said field effect transistor of said second type of conductivity being minimal and said length of said field-effect transistor of said first conductivity type being approximately twice as long as that of said channel length of said field-effect transistor of the second conductivity type so that said second inverter comprises an asymmetrical threshold unequal to half the supply voltage, whereby said minimal channel length is defined by the manufacturing process.

5. The static memory cell according to claim 4, wherein:
each of said inverters comprises a field effect transistor of a first conductivity type and a field effect transistor of a second conductivity type;

said second field effect transfer transistor of said first conductivity type comprises a channel including a channel width;

said field effect transistor of the first conductivity type of said first inverter comprising a channel including a channel width; and said width of said channel of said second field effect transfer transistor dimensioned considerably larger than the channel width of said field effect transistor of the first conductivity type in said first inverter in order to be able to more quickly modulate the charge on said read data line.

6. The static memory cell of claim 5, wherein:
each of said field effect transistors of said first conductivity type is an n-channel field effect transistor; and each of said field effect transistors of said second conductivity type is a p-channel field effect transistor.

7. The static memory cell of claim 6, wherein:
each of said field effect transistors of said first conductivity type is a p-channel field effect transistor; and each of said field effect transistors of said second conductivity type is an n-channel field effect transistor.

8. A static memory cell comprising:
first, second, third, fourth, fifth and sixth field effect transistors each including a gate and first and second terminals, said first and second field effect transistors being transfer transistors;

said first, second, fourth and sixth field effect transistors being of a first conductivity type;

said third and fifth field effect transistors being of a second conductivity type;

a first data line connected to said second terminal of said first field effect transistor for receiving input data to be written into the memory cell;

a second data line connected to said first terminal of said second field effect transistor to receive read data output from the memory cells;

a write word line for receiving write control signals connected to said gate of said first field effect transistor for activating said first field effect transistor in response to a write control signal;

a read word line for receiving read control signals connected to said gate of said second field effect transistor for activating said second field effect transistor in response to a read control signal;

said third and fourth field effect transistors forming a first inverter;

said fifth and sixth field effect transistors forming a second inverter;

said first terminals of said third and fifth field effect transistors connected to a first potential;

said second terminals of said fourth and sixth field effect transistors connected to a second potential;

said gates of said third and fourth field effect transistors connected together to form an input for said first inverter and connected to said first terminal of said first field effect transistor;

said second terminal of said third field effect transistor connected to said first terminal of said fourth field effect transistor forming an output of said first inverter, said output of said first inverter connected to said second terminal of said second field effect transistor;

said gates of said fifth and sixth field effect transistors connected together forming an input of said second inverter and connected to said output of said first inverter;

said second terminal of said fifth field effect transistor and said first terminal of said sixth field effect transistor connected together forming an output of said second inverter and connected to said input of said first inverter to maintain the data stored in the memory cell;

another write word line for receiving write control signals;

a seventh field effect transistor of the second conductivity type including a gate and first and second terminals;

said first terminal of said seventh field effect transistor connected to said first terminal of said first field effect transistor;

said second terminal of said seventh field effect transistor connected to said second terminal of said first field effect transistor; and said gate of said seventh field effect transistor connected to said another word line for activating said seventh field effect transistor during a write event and during the activation of said first field effect transistor.

9. A static memory cell comprising:

first, second, third, fourth, fifth, sixth and seventh field effect transistors each including a gate and first and second terminals, said first, second and seventh field effect transistors being transfer transistors;

said first, second, fourth, sixth and seventh field effect transistors being of a first conductivity type;

said third and fifth field effect transistors being of a second conductivity type;

a first data line connected to said second terminal of said first field effect transistor for receiving input data to be written into the memory cell;

a second data line connected to said first terminal of said second field effect transistor to receive read data output from the memory cell;

said second terminal of said seventh field effect transistor and said first terminal of said first field effect transistor connected together;

a write word line for receiving write control signals connected to said gate of said first field effect transistor for activating said first field effect transistor in response to a write control signal;

a column write word line for receiving write control signals and connected to said gate of said seventh field effect transistor for activating said seventh field effect transistor in response to a write control signal and during activation of said first field effect transistor;

a read word line for receiving read control signals connected to said gate of said second field effect transistor for activating said second field effect transistor in response to a read control signal;

said third and fourth field effect transistors forming a first inverter;

said fifth and sixth field effect transistors forming a second inverter;

said first terminals of said third and fifth field effect transistors connected to a first potential;

said second terminals of said fourth and sixth field effect transistors connected to a second potential;

said gates of said third and fourth field effect transistors connected together to form an input for said first inverter and connected to said first terminal of said seventh field effect transistor;

said second terminal of said third field effect transistor connected to said first terminal of said fourth field effect transistor forming an output of said first inverter, said output of said first inverter connected to said second terminal of said second field effect transistor;

said gates of said fifth and sixth field effect transistors connected together forming an input of said second inverter and connected to said output of said first inverter; and said second terminal of said fifth field effect transistor and said first terminal of said sixth field effect transistor connected together forming an output of said second inverter and connected to said input of said first inverter to maintain the data stored in the memory cell.

10. A static memory cell comprising:

first, second, third, fourth, fifth, sixth and seventh field effect transistors each including a gate and first and second terminals, said first, second and seventh field effect transistors being transfer transistors;

said first, second, fourth, sixth and seventh field effect transistors being of a first conductivity type;

said third and fifth field effect transistors being of a second conductivity type;

a first data line connected to said second terminal of said first field effect transistor for receiving input data to be written into the memory cell;

a second data line connected to said first terminal of said second field effect transistor to receive read data output from the memory cell;

said second terminal of said seventh field effect transistor connected to said first terminal of said first field effect transistor;

a write word line for receiving write control signals connected to said gate of said first field effect transistor and to said gate of said second field effect transistor for activating said first field effect transistor during a write event and for activating said second field effect transistor during a read event;

a write column word line for receiving write control signals connected to said gate of said seventh field effect transistor for activating said seventh field effect transistor during a write event and during activation of said first field effect transistor;

said third and fourth field effect transistors forming a first inverter;

said fifth and sixth field effect transistors forming a second inverter;

said first terminals of said third and fifth field effect transistors connected to a first potential;

said second terminals of said fourth and sixth field effect transistors connected to a second potential;

said gates of said third and fourth field effect transistors connected together to form an input for said inverter and connected to said first terminal of said seventh field effect transistor;

said second terminal of said third field effect transistor connected to said first terminal of said fourth field effect transistor forming an output of said first inverter, said output of said first inverter connected to said second terminal of said second field effect transistor;

said gates of said fifth and sixth field effect transistors connected together forming an input of said second inverter and connected to said output of said first inverter; and said second terminal of said fifth field effect transistor and said first terminal of said sixth field effect transistor connected together forming an output of said second inverter and connected to said input of said first inverter to maintain the data stored in the memory cell.

11. A static memory cell comprising:
first and second field-effect transfer transistors of a first conductivity type each including a gate and first and second terminals;
first and second inverters each including an input and an output;
first and second data lines;
first and second word lines;
said input of said first inverter connected to said first terminal of said first field-effect transfer transistor;
said output of said first inverter connected to said second terminal of said second field-effect transfer transistor;
said input of said second inverter connected to said output of said first inverter, said output of said second inverter connected to said input of said first inverter as a signal feedback path to statically maintain the cell information;
said gate and said first field-effect transfer transistor connected to said first word line, and said first word line constituting a write word line for activating said first field-effect transfer transistor in response to a write control signal;
said gate of said second field-effect transistor connected to said second word line, and said second word line constituting a read word line for activating said second field-effect transfer transistor in response to a read control signal;
said first data line connected to said second terminal of said first-field effect transfer transistor for receiving data to be written into said memory cell;
said first terminal of said second field-effect transfer transistor connected to said second data line to provide read data from said memory cell; and
a third inverter including an input and an output and connected between said output of said first inverter and said second terminal of said second field-effect transfer transistor with said input connected to said output of said first inverter and said output connected to said second terminal of said second field-effect transfer transistor.

12. A static memory cell comprising
first and second field-effect transfer transistors of a first conductivity type each including a gate and first and second terminals;
first and second inverters each including an input and an output;
first and second data lines;
first and second word lines;
said input of said first inverter connected to said first terminal of said first field-effect transfer transistor;
said output of said first inverter connected to said second terminal of said second transfer transistor;
said input of said second inverter connected to said output of said first inverter, and said output of said second inverter connected to said input of said first inverter as a signal feedback path to statically maintain the cell information;
said gate of said first field-effect transfer transistor connected to said first word line, and said first word line constituting a write word line for activating said first field-effect transfer transistor in response to a write control signal;
said gate of said second field-effect transfer transistor connected to said second word line, and said second word line constituting a read word line for activating said second field-effect transfer transistor in response to a read control signal;
said first data line connected to said second terminal of said first field effect transfer transistor for receiving data to be written into said memory cell;
said first terminal of said second field-effect transfer transistor connected to said second data line to provide read data from said memory cell;
a third field-effect transfer transistor of a second conductivity type including a gate and first and second terminals;
said first and second terminals respectively connected to said first and second terminals of said first field effect transfer transistor; and
a third word line for receiving write control signals connected to said gate of said third field-effect transfer transistor for activating said third field effect transistor during a write event.

13. A static memory cell comprising:
first and second field-effect transfer transistors of a first conductivity type each including a gate and first and second terminals;
first and second inverters each including an input and an output;
first and second data lines;
first and second word lines;
said input of said first inverter connected to said first terminal of said first field-effect transfer transistor;
said output of said first inverter connected to said second terminal of said second field-effect transfer transistor;
said input of said second inverter connected to said output of said first inverter, and said output of said second inverter connected to said input of said first inverter as a signal feedback path to statically maintain the cell information;
said gate of said first field-effect transfer transistor connected to said first word line, and said first word line constituting a write word line for activating said first field-effect transfer transistor in response to a write control signal;
said gate of said second field-effect transfer transistor connected to said second word line, and said second word line constituting a read word line for activating said second field-effect transfer transistor in response to a read control signal;
said first data line connected to said second terminal of said first field effect transfer transistor for receiving data to be written into said memory cell;
said first terminal of said second field effect transfer transistor connected to said second data line to provide read data from said memory cell;
a column word line for receiving read and write control signals;
a third field effect transfer transistor of the first conductivity type including a gate and first and second terminals, said first terminal connected to said first terminal of said first field effect transfer transistor and said second terminal connected to said input of said first inverter; and
said gate of said third field effect transfer transistor connected to said column word line for activating said third field effect transfer transistor in response to said read and write control signals, respectively.

14. A static memory cell comprising:

first and second field-effect transfer transistors of a first conductivity type each including a gate and first and second terminals;

first and second inverters each including an input and an output;

first and second data lines;

first and second word lines;

said input of said first inverter connected to said first terminal of said first field-effect transfer transistor;

said output of said first inverter connected to said second terminal of said second field-effect transfer transistor;

said input of said second inverter connected to said output of said first inverter, and said output of said second inverter connected to said input of said first inverter as a signal feedback path to statically maintain the cell information;

said gate of said first field-effect transfer transistor connected to said first word line, and said first word line constituting a write word line for activating said first field effect transfer transistor in response to a write control signal;

said gate of said second field-effect transfer transistor connected to said second word line, and said second word line constituting a read word line for activating said second field-effect transfer transistor in response to a read control signal;

said first data line connected to said second terminal of said first field-effect transfer transistor for receiving data to be written into said memory cell; and said first terminal of said second field-effect transfer transistor connected to said second data line to provide read data from said memory cell, each of said inverters comprising a field-effect transistor of a first conductivity type and a field-effect transistor of a second conductivity type each including a gate and first and second terminals, said gates connected together to form said input, said first terminals connected together to form said output, and said second terminals connected to respective potential contacting points, said first and second inverters being asymmetrically designed with respect to one another, each of said field-effect transistors of said first inverter comprising a channel including a channel length and a channel width, said channel widths being identical an said channel lengths being minimal so that said first inverter comprises an asymmetrical threshold, each of said field-effect transistors of said second inverter comprising a channel including a length and a width, said width being identical and minimal and said channel length of said field-effect transistor of said second conductivity type being minimal and said length of said field-effect transistor of said first conductivity being approximately twice as long as that of said channel length of said field-effect transistor of said second conductivity type so that said second inverter comprises an asymmetrical threshold unequal to half the supply voltage, whereby said minimum channel length is defined by the manufacturing process.

15. The static memory cell of claim 14, wherein:

said field effect transistor of said first conductivity type is a p-channel field effect transistor; and said field effect transistor of said second conductivity type is an n-channel field effect transitor.

* * * * *